(12) United States Patent
Sumida

(10) Patent No.: US 6,611,931 B1
(45) Date of Patent: Aug. 26, 2003

(54) CHECK METHOD OF TEMPORARY STORAGE CIRCUIT IN ELECTRONIC CONTROL UNIT

(75) Inventor: Yoshitaka Sumida, Nagoya (JP)

(73) Assignees: Autonetworks Technologies, Ltd., Nagoya (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 431 days.

(21) Appl. No.: 09/709,717

(22) Filed: Nov. 13, 2000

(30) Foreign Application Priority Data

Nov. 15, 1999 (JP) ............................................. 11-323765
Nov. 15, 1999 (JP) ............................................. 11-323967

(51) Int. Cl.$^7$ .............................................. G11C 29/00
(52) U.S. Cl. ........................................ 714/719; 714/718
(58) Field of Search .............................. 714/710, 719, 714/718, 723; 701/45, 29; 365/185.04

(56) References Cited

U.S. PATENT DOCUMENTS

| | | | |
|---|---|---|---|
| 4,558,446 A | * 12/1985 | Banba et al. ................ | 714/710 |
| 5,351,185 A | 9/1994 | Takeuchi et al. | |
| 5,602,736 A | * 2/1997 | Toya et al. ................... | 701/45 |
| 5,682,314 A | * 10/1997 | Nishino et al. .............. | 701/29 |
| 5,802,485 A | * 9/1998 | Koelle et al. ................ | 701/29 |
| 6,046,937 A | * 4/2000 | Komori et al. .......... | 365/185.04 |

FOREIGN PATENT DOCUMENTS

| JP | 60-244650 A | | 12/1985 |
|---|---|---|---|
| JP | 62084500 A | * | 4/1987 |

* cited by examiner

*Primary Examiner*—David Ton
(74) *Attorney, Agent, or Firm*—Oliff & Berridge, PLC

(57) ABSTRACT

Data in a RAM indicated by a top address is read, the read contents are written into the next address, and the operation is repeated to an end address, then the RAM value at the end address is compared with the RAM value at the top address. If the RAM values are the same, all the RAM is determined to be normal. The data comparison processing may include only one comparison with the end address data. Additionally, a ROM may be checked in a distributed manner in the wait time of main processing, rather than being checked in initial processing.

5 Claims, 13 Drawing Sheets

CHECK METHOD OF TEMPORARY STORAGE CIRCUIT IN ELECTRONIC CONTROL UNIT

BACKGROUND OF THE INVENTION

This invention relates to a check method of a temporary storage circuit in an electronic control unit for an automobile using a microcomputer for checking the read operation and the write operation of the temporary storage circuit in the electronic control unit for an automobile.

FIG. 5 is a block diagram to show a summary of the internal configuration of a general microcomputer. In a microcomputer MC used with an electronic control unit for an automobile, as shown in FIG. 5, a CPU (central control unit) 3 reads software programs and various data previously stored in ROM (read-only memory) 1 through a register 2 and executes various logical operations based on the software programs and data. At the time, the information in the ROM 1, various pieces of information given from the outside, or the operation processing result, etc., of the CPU 3 is once stored in a temporary storage circuit (RAM (random access memory)) 4 and the CPU 3 uses the information in the RAM 4 to perform operation processing, whereby the whole processing speed is increased. Therefore, the RAM 4 is indispensable for the CPU 3 to perform operation processing and it is extremely important for the RAM 4 to operate normally.

By the way, generally the RAM 4 is often checked for error at the product shipment. After the product shipment, a part of the RAM 4 may become unable to operate normally for some reason of noise, etc., in which case it may be feared that an anomaly may occur in program processing. Particularly, in electronic devices for an automobile, a malfunction caused by an anomaly of the RAM 4 must be absolutely avoided, thus it is more important than anything else to check that the RAM 4 is normal.

Thus, in fact, when the microcomputer MC is started, it is necessary to check whether or not the RAM 4 operates normally together with operation check of the register 2.

To check the RAM 4, in a related art, predetermined data is once written into all addresses in the RAM 4, next the data at the first address is read and whether or not the data is the same as the original data is checked. Subsequently, the address is incremented in order and a similar check is executed on the whole areas of the RAM 4, whereby a check can be made to ensure that the whole RAM 4 is normal.

Specifically, when the RAM 4 is checked, as shown in FIG. 6, first at step So1, the top address of the RAM 4 is set in a predetermined 16-bit register part in the register 2, which will be hereinafter referred to as HL register. At step So2, a numeric value "00000000" (the 8-bit numeric value "00000000" will be hereinafter abbreviated to "00H (hexa)") is stored in a predetermined eight-bit (one-byte) register part, which will be hereinafter referred to as A register, different from the HL register for resetting the A register. Subsequently, at step So3, predetermined specific data (data) is stored in the A register. At step So4, the data in the A register is written into "HL" address of the HL register and step So5, the numeric value "00H" is stored in the A register for resetting, then at step So6, the data stored at the "HL" address of the HL register is read into the A register.

At step So7, whether or not the current value of the A register is the same as the value of the first "data" is determined. If the current value of the A register is the same as the value of the first "data," control goes to step So8 and whether or not the address "HL" is the end address of the RAM 4 is determined. If the address "HL" is not the end address, control goes to step So9 and the "HL" address of the HL register is incremented and control returns to step So2 and processing is repeated.

If the value of the A register is not the same as the value of the first "data" at step So7, it is assumed that an error occurs in the RAM 4, and control goes to step So10 and predetermined error handling is executed.

Thus, the processing at step So2 and the later steps is repeated until the address "HL" reaches the end address of the RAM 4 and when the address "HL" reaches the end address, a transition to the next processing as the microcomputer MC is made (step So11).

In FIG. 5, numeral 5 denotes an input I/F (interface) circuit for inputting an external signal to the CPU 3 and numeral 6 denotes an output I/F (interface) circuit for sending the operation processing result of the CPU 3 to the outside. The above-described "HL" means that two eight-bit unit registers of high-order eight bits (H) and the low-order eight bits (L) are used to handle one 16-bit (two-byte) data string.

However, in recent years, the program data has become huge and thus the area of the RAM 4 in the microcomputer MC has also become huge and often it has taken a great deal of processing time in checking the RAM 4. Particularly, if whether or not the value of the A register is the same as the value of the first "data" is determined for every address "HL" of the HL register as at step So7 in FIG. 6, it is indispensable that the processing time becomes enormous. Thus, the initialization time is prolonged and the transition to the main program is delayed. Consequently, a delay occurs in the control system and there is a possibility that the machine operation may be hindered.

For example, with the electronic control unit for performing head lamp drive processing, if an instantaneous power interruption or reset occurs with the head lamps on during running, a disadvantage of prolonging the time to again turning on the head lamps or the like occurs if the initial processing takes a long time.

This invention relates to a check method of a storage circuit in an electronic control unit for an automobile using a microcomputer for checking the read operation and the write operation of the storage circuit in the electronic control unit for an automobile.

FIG. 11 is a block diagram to show a summary of the internal configuration of a general microcomputer. In a microcomputer MC used with an electronic control unit for an automobile, as shown in FIG. 11, a CPU (central control unit) 203 reads software programs and various data previously stored in a storage circuit (ROM (read-only memory)) 201 through a register 202 and executes various logical operations based on the software programs and data. At the time, the information in the ROM 201 or the operation processing result, etc., of the CPU 203 is once stored in RAM (random access memory) 204 and the CPU 203 uses the information in the RAM 204 to perform operation processing.

In FIG. 11, numeral 205 denotes an input I/F (interface) circuit for inputting an external signal to the CPU 203 and numeral 206 denotes an output I/F (interface) circuit for sending the operation processing result of the CPU 203 to the outside.

With the electronic control unit for an automobile, the CPU 203 takes charge of drive control of various drive systems and thus operates on a major premise that the CPU 203 does not malfunction to ensure sufficient safety of running the automobile. Therefore, it is indispensable that the software programs, etc., previously stored in the ROM 201 should be read into the CPU 203 unerringly. Thus, when the microcomputer MC is started, it is important to check whether or not the software programs, data, and the like are read unerringly from the ROM 201 as well as to check the register 202 and the RAM 204 for operation.

To check the ROM 201, addition operation is performed on the program data corresponding to each address in order and is repeated to the end of the program, then the last low-order 16-bit (two-byte) data is compared with reference data previously stored in a predetermined area of the ROM 201, whereby the ROM 201 can be checked easily.

FIG. 12 is a flowchart to show the operation after the microcomputer MC is started. First, after the power of the microcomputer MC is turned on or reset is released, initialization is executed at step Sp201. Specifically, at step Sp201, the operation frequency magnification of the CPU 203 (FIG. 11) to an operation clock provided by a predetermined oscillator, ports in the input IF 205 and the output interface 206, enable or disable of interrupt service, and the like are set.

Next, at step Sp202, the RAM 204 in the microcomputer MC is checked and further at step Sp203, the ROM 201 in the microcomputer MC is checked. Then, at steps Sp204 to Sp207, processing concerning various drive systems including room lamp processing, door lock processing, head lamp processing, and buzzer processing is executed repeatedly every predetermined time. Processing at steps Sp201 to Sp203 is generally called initial processing In and processing at steps Sp204 to Sp207 is generally called main processing Mn.

Checking the ROM 201 at step Sp203 in FIG. 12 will be discussed in detail with reference to a flowchart of FIG. 13. When the ROM 201 is checked, first the register 202 is checked at step So201 in FIG. 13, next at step So202, a numeric value of zero is assigned to a 16-bit register part, which will be hereinafter referred to as BC register, into which a predetermined eight-bit register part (B register) and a predetermined eight-bit register part (C register) following the B register are combined for initialization. At step So203, the top address of the ROM 201 is set in a predetermined 16-bit register part, which will be hereinafter referred to as HL register, as a value (address) of "HL."

Subsequently, at step So204, the data at the address "HL" of the ROM 201 is read and is written into a predetermined eight-bit register part (A register). At step So205, the value in the A register is added to the value in the BC register and the result is new data in the BC register.

Next, at step So206, the value of the address "HL" is incremented and at step So207, the incremented address "HL" is compared with the value of subtracting numeric value "two bytes" from the end address of the ROM 201. If the incremented address "HL" is equal to or less than the value of subtracting numeric value "two bytes" from the end address of the ROM 201, steps So204 to So207 are repeated. On the other hand, if the incremented address "HL" is greater than the value of subtracting numeric value "two bytes" from the end address of the ROM 201, control goes to step So208.

At step So208, the value of subtracting numeric value "one byte" from the end address of the ROM 201 is stored in a predetermined 16-bit register part, which will be hereinafter referred to as DE register. A predetermined eight-bit register part (D register) and a predetermined eight-bit register part (E register) following the D register are used in combination as the DE register. The address subtracting numeric value "one byte" from the end address of the ROM 201 means the head position of the last eight-bit (one-byte) data in the ROM 201 and here, the above-mentioned reference data is previously stored.

The numeric value "DE" in the DE register is read as address and step So209, the data stored at the address "DE" in the ROM 201 (reference data) is read and is stored in the HL register.

At step So210, the value in the HL register (reference data) is compared with the value in the BC register (low-order 16-bit data provided by adding the program data at the addresses) and if they differ, control goes to step So211 and predetermined error handling is performed. On the other hand, if the value in the HL register and the value in the BC register match, it can be determined that all values in the ROM 201 repeatedly added at step So205 have been read normally. In this case, control goes to step So212 and the main processing Mn is executed.

However, in recent years, the program data has become huge and thus the storage area in the ROM 201 has also become large. Therefore, to use the method of adding the data in the address order of the ROM 201 as previously described with reference to FIG. 11, the number of times operation processing is performed becomes enormous. Thus, the initialization time is prolonged and the transition to the main processing Mn at step So212 is delayed. Consequently, a delay occurs in the control system and there is a possibility that the machine operation may be hindered.

For example, with the electronic control unit for performing head lamp drive processing, if an instantaneous power interruption or reset occurs with the head lamps on during running, a disadvantage of prolonging the time to again turning on the head lamps or the like occurs if the initial processing takes a long time.

SUMMARY OF THE INVENTION

It is therefore an object of the invention to provide a check method of a temporary storage circuit in an electronic control unit capable of decreasing a delay of a control system by shortening the check processing time of whole RAM and shortening the time taken in initialization processing.

To the end, according to the invention as in aspect 1, there is provided, in an electronic control unit wherein a central control unit once stores various data and a software program in a temporary storage circuit and executes predetermined control processing, a check method of the temporary storage circuit in the electronic control unit for executing an operation check of the temporary storage circuit before the control processing, the check method comprising the first step of predetermined data into the top address of the temporary storage circuit, the second step of reading the data at the top address and writing the data into the next address and the later addresses repeatedly in order, and the third step of comparing the data at the end address with the data at the top address only once after the data is written into the end address at the second step and if the data at the end address and the data at the top address are the same, determining that the read operation and the write operation of the data at all addresses of the temporary storage circuit are normal and on the other hand, if the data at the end address and the data at the top address are not the same, determining that the read operation and the write operation of the temporary storage circuit are abnormal.

In the invention as in aspect 2, the electronic control unit is an electronic control unit for an automobile, installed in an automobile, and the control processing executed by the central control unit of the electronic control unit is drive control of various drive systems of an automobile.

Further, it is therefore another object of the invention to provide a check method of a storage circuit in an electronic control unit capable of decreasing a delay of a control system by shortening the check processing time of whole ROM and shortening the time taken in initialization processing.

To the end, according to the invention as in aspect 3, there is provided, in an electronic control unit wherein a central control unit executes predetermined control processing based on various data and a software program previously stored in a storage circuit, a check method of the storage circuit in the electronic control unit for executing an operation check of the storage circuit, the check method comprising the first step of sensing whether or not the predetermined control processing is in a time wait state after predetermined initial processing, the second step of executing the predetermined control processing if the fact that the predetermined control processing is not in a time wait state is detected at the first step, and the third step of checking the storage circuit within the wait time of the predetermined control processing only if the fact that the predetermined control processing is in a time wait state is detected at the first step.

In the invention as in aspect 4, the third step comprises the steps of sensing whether or not checking the storage circuit is complete and if checking the storage circuit is complete, returning to the first step, incrementing an address of the storage circuit each time the fact that checking the storage circuit is incomplete, each time the address is incremented, accumulating data at the incremented address to provide check sum data, each time the check sum data is provided, sensing whether or not the accumulation processing reaches the last stage based on the incremented address and if the accumulation processing does not reach the last stage, returning to the first step, and if the fact the accumulation processing reaches the last stage is detected, comparing the check sum data with predetermined reference data and if the check sum data and the reference data match, determining that the storage circuit operates normally and on the other hand, if the check sum data and the reference data do not match, determining that the storage circuit is abnormal.

In the invention as in aspect 5, the electronic control unit is an electronic control unit for an automobile, installed in an automobile, and the control processing executed by the central control unit of the electronic control unit is drive control of various drive systems of an automobile.

DETAILED DESCRIPTION OF THE PREFERRED EMBODIMENTS

<Configuration>

In an electronic control unit for an automobile according to one embodiment of the invention, the RAM data indicated by the top address is read, the read contents are written into the next address, and the operation is repeated to the end address, then the RAM value at the end address is compared with the RAM value at the top address only once and if the RAM values are the same, all the RAM is determined to be normal, whereby the RAM check routine is simplified for shortening the check processing time.

Figure 1:
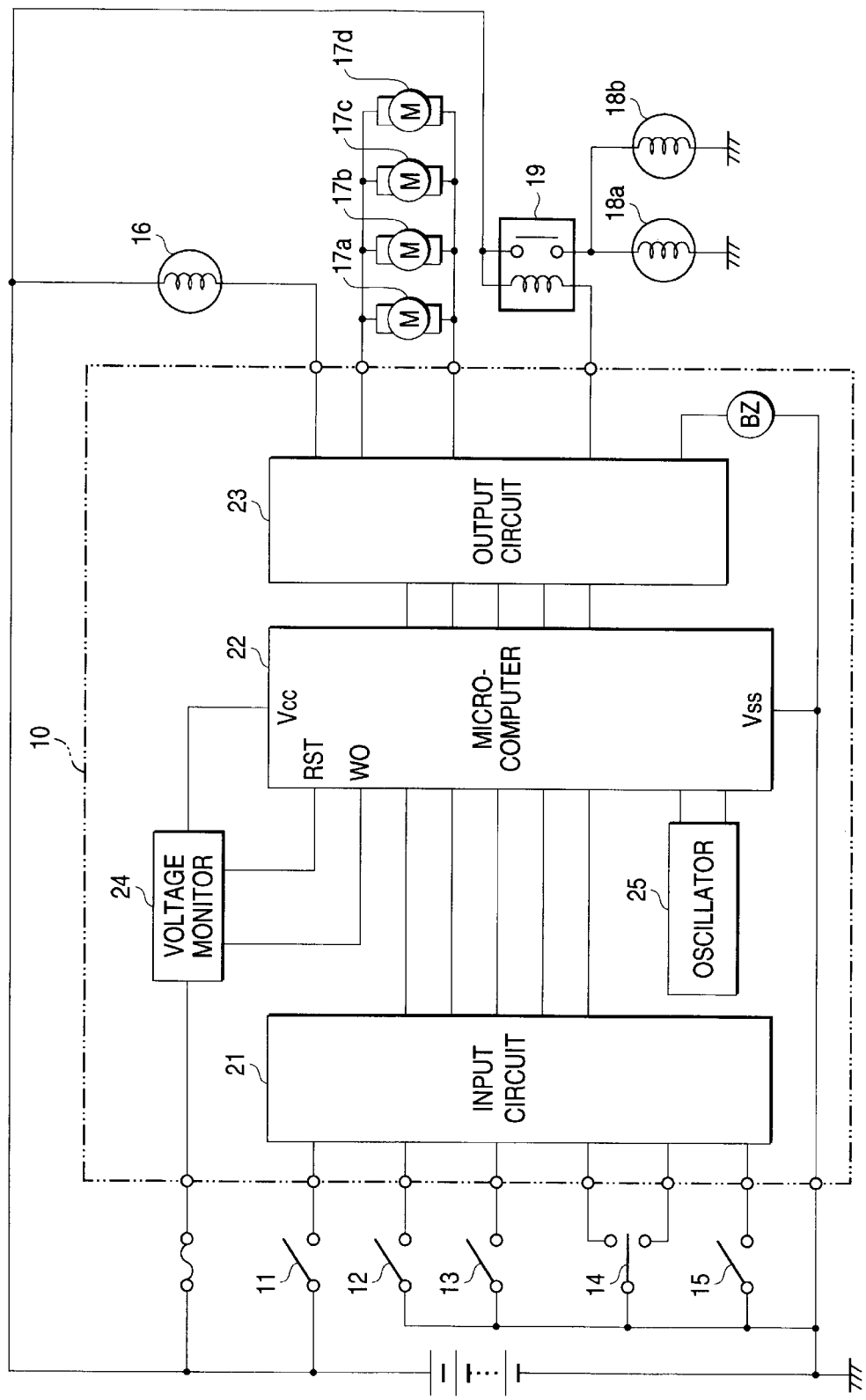
FIG. 1 is a block diagram to show an electronic control unit for an automobile.

FIG. 1 is a block diagram to show an electronic control unit for an automobile 10 according to one embodiment of the invention and its peripheral devices. As in FIG. 1, in the electronic control unit for an automobile 10, input signals from various input systems 11 to 15 of an ignition key 11, a key presence/absence switch 12, a door open/close switch 13, a door lock/unlock switch 14, and a head lamp switch 15 are input, and various drive systems 16 to 19 of a room lamp 16, door lock motors 17a to 17d, a buzzer BZ, and a head lamp relay 19 for switching drive of head lamps 18a and 18b are controlled based on the input signals. Various types of operation control are performed, for example, in such a manner that the buzzer BZ is sounded when the door open/close switch 13 senses an open state of a door although insertion of a key is sensed with the key presence/absence switch 12, that the door lock motors 17a to 17d are driven for locking or unlocking a door as the door lock/unlock switch 14 is switched on or off, and that the head lamp relay 19 is operated for switching drive of the head lamps 18a and 18b as the head lamp switch 15 is switched on or off.

The input signals from the various input systems 11 to 15 are input through an input circuit 21 in the electronic control unit for an automobile 10 to a microcomputer 22, which then performs various types of branch determination processing and operation processing on the input signals and outputs drive signals through an output circuit 23 to the various drive systems 16 to 19. A voltage monitor circuit (watchdog circuit) 24 always monitors whether or not the microcomputer 22 is in the normal state. In FIG. 1, numeral 25 denotes an oscillator for ordering an operation clock of the microcomputer 22.

Figure 5:
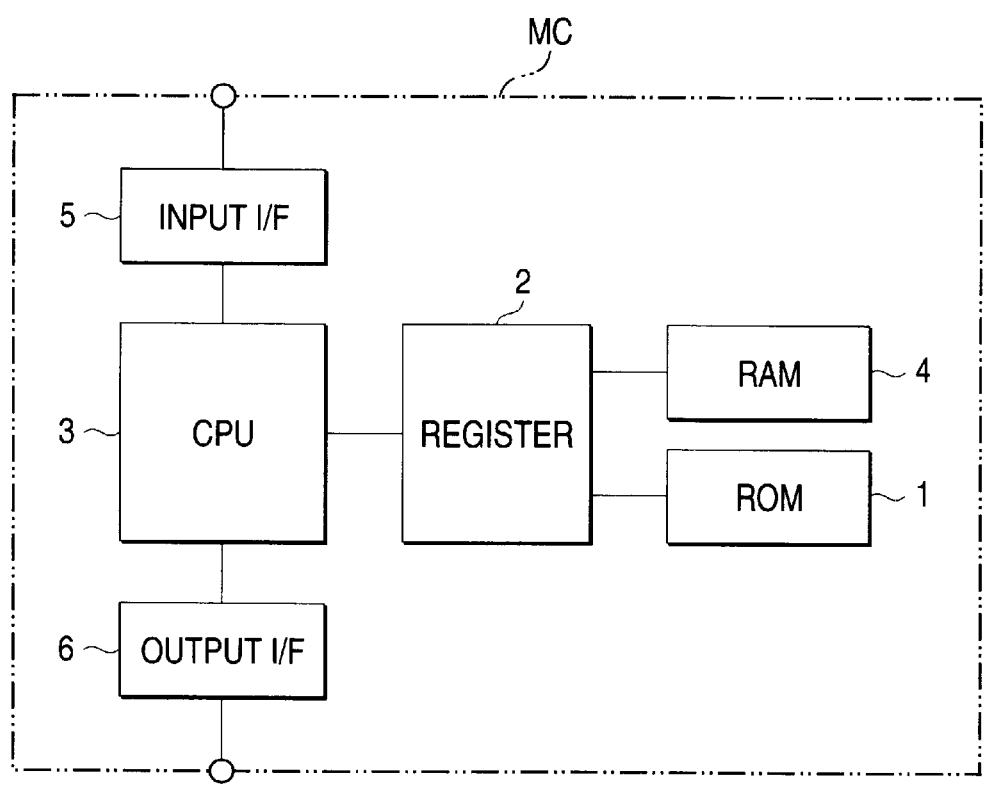
FIG. 5 is a block diagram to show the internal configuration of a general electronic control unit for an automobile.

The internal configuration of the microcomputer 22 (MC) is the same as that of the general microcomputer shown in FIG. 5 and therefore will not be discussed again.

<Operation>

Figure 2:
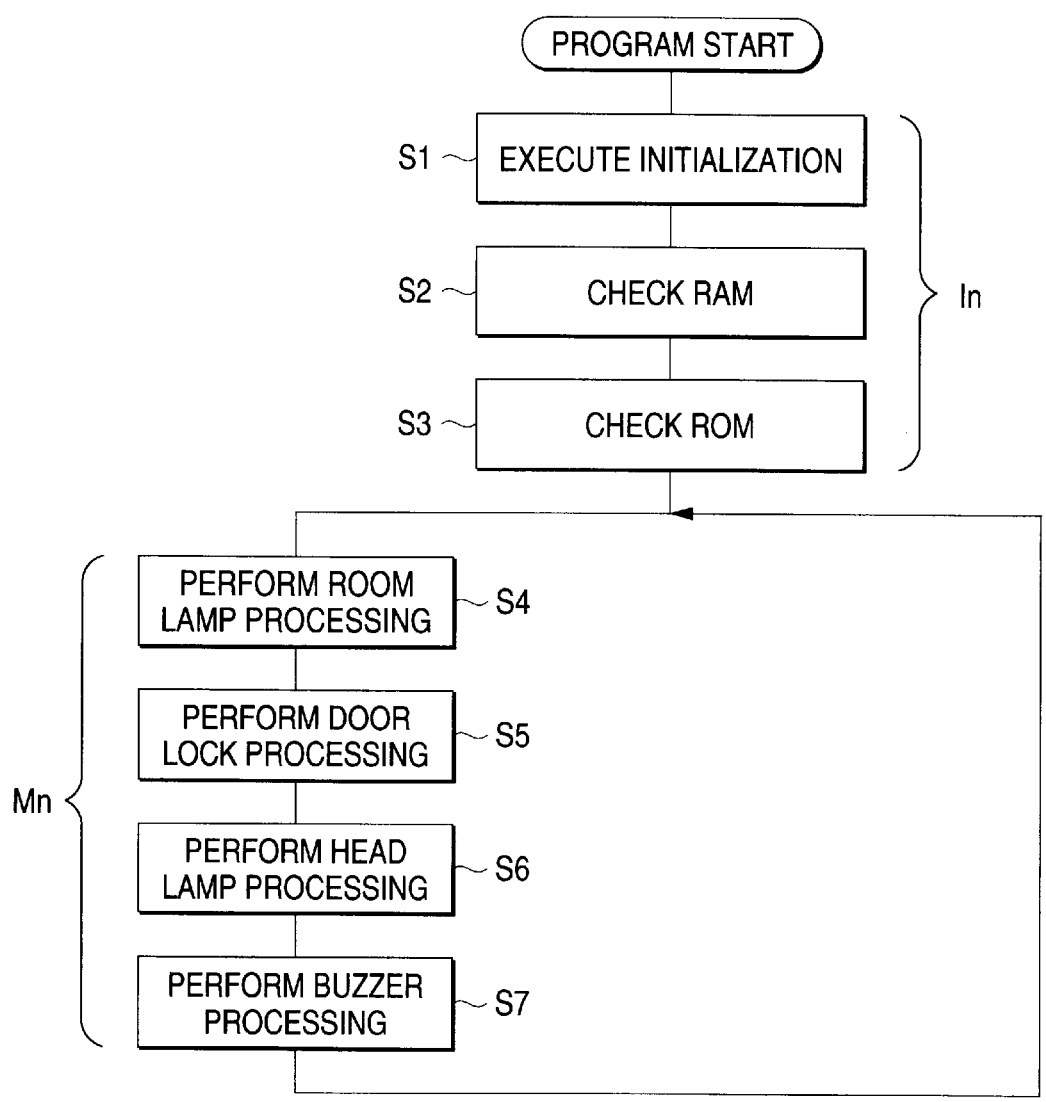
FIG. 2 is a flowchart to show a general operation procedure of the electronic control unit for an automobile.

FIG. 2 is an operation flowchart of the electronic control unit for an automobile 10. After the power of the electronic control unit for an automobile 10 is turned on or reset is released, initialization is executed at step S1. Specifically, at step S1, the operation frequency magnification of the CPU 3 (FIG. 5) to the operation clock provided by the oscillator 25, ports in the input circuit 21 and the output circuit 23, enable or disable of interrupt service, and the like are set. Checking a register 2 is also executed in the initialization.

Next, at step S2, the RAM 4 in the microcomputer 22 is checked and further at step S3, the ROM 1 in the microcomputer 22 is checked. Then, at steps S4 to S7, processing concerning the various drive systems 16 to 19 including room lamp processing, door lock processing, head lamp processing, and buzzer processing is executed repeatedly every predetermined time. The processing at steps S1 to S3 is generally called initial processing In.

Step S2 in FIG. 2 will be discussed in detail with reference to a flowchart of FIG. 3.

Figure 3:
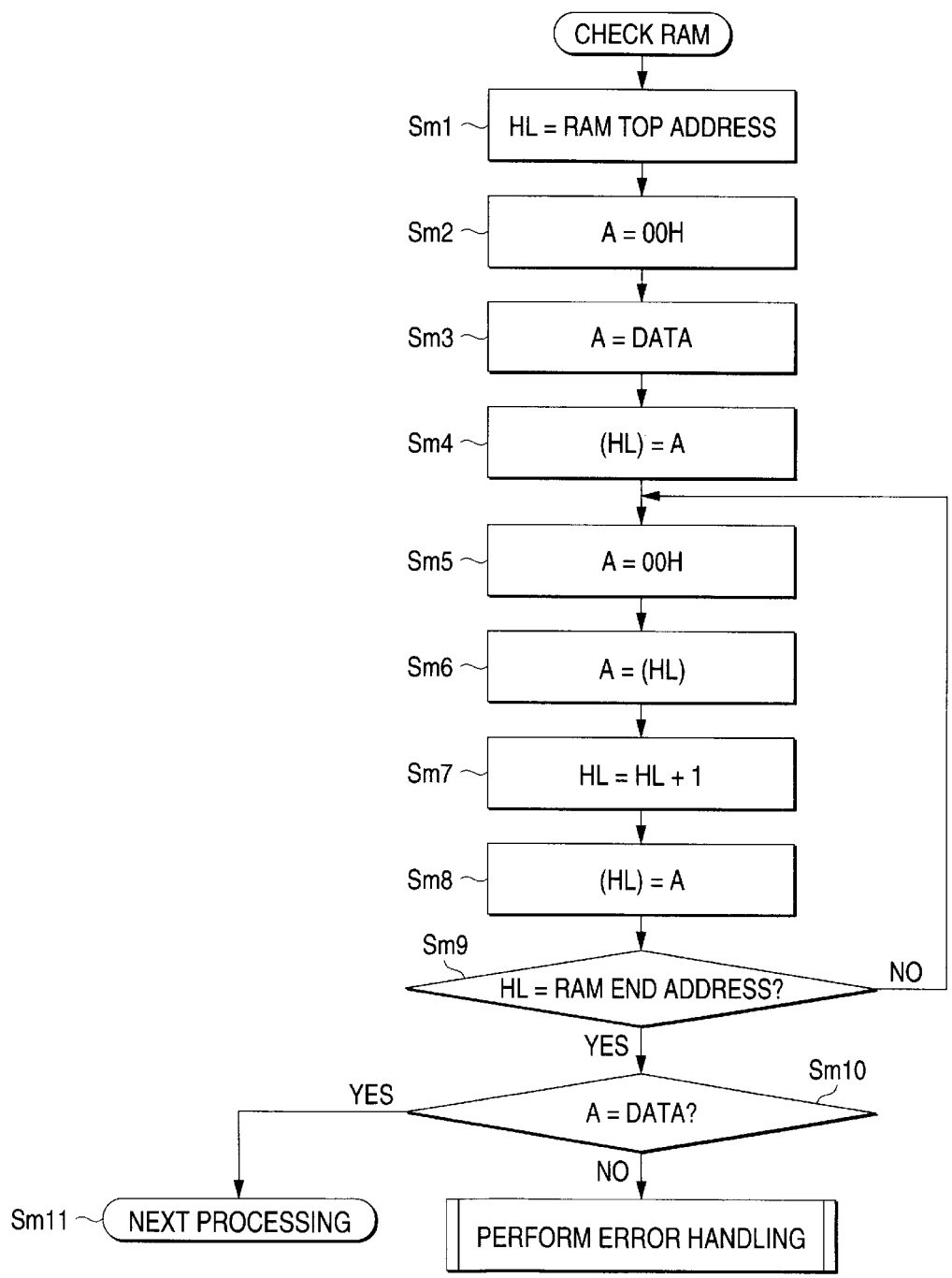
FIG. 3 is a flowchart to show a check routine of RAM in the electronic control unit for an automobile according to one embodiment of the invention and its peripheral devices.

Specifically, when the RAM 4 is checked, as in FIG. 3, first the top address of the RAM 4 is set in a predetermined 16-bit HL register in the register 2 at step Sm1. At step Sm2, a numeric value of "00H" is stored in an eight-bit register (called A register) different from the HL register for resetting. Subsequently, at step Sm3, predetermined specific data (data) is stored in the A register. At step Sm4, the data in the A register is written into "HL" address of the HL register and at step Sm5, a numeric value of "00H" is stored in the A register for resetting, then at step Sm6, the data stored at the "HL" address of the HL register is read into the A register. At step Sm7, the "HL" address of the HL register is incremented, then at step Sm8, the data in the A register is written into the post-incremented "HL" address.

The operation at steps Sm5 to Sm8 is repeated until the address "HL" reaches the end address of the RAM 4 (step Sm9). At step Sm10, the value stored at the address immediately preceding the end address of the RAM 4 (the data stored in the A register at step Sm6) is compared with the value of the first "data" to determine whether or not they match. If they match, further the end address is checked, namely, whether or not the value stored at the end address of the RAM 4 (the data stored in the A register at step Sm6) matches the value of the first "data" is checked (not shown in FIG. 3), then control goes to the next step (step Sm11). In this case, if the value stored at the end address of the RAM4 (the data stored in the A register at step Sm6) does not match the value of the first "data" although not shown in FIG. 3, control goes to step Sm12 and error handling is executed.

On the other hand, if it is determined at step Sm10 that the value stored at the address immediately preceding the end address of the RAM 4 (the data stored in the A register at step Sm6) differs from the value of the first "data," error handling is executed at step Sm12.

Thus, in the electronic control unit for an automobile 10, the data in the RAM 4 indicated by the top address is read, the read contents are written into the next address, and the operation is repeated to the end address, then the RAM value at the end address is compared with the RAM value at the top address only once and if the values are the same, all the RAM is determined to be normal. Thus, the data comparison processing may be only one comparison with the end address data as compared with the example in the related art previously described with reference to FIG. 6; the RAM 4 check routine can be simplified and it is made possible to drastically shorten the check processing time. Therefore, the time taken in the initial processing In (steps S1 to S3 in FIG. 2) can be shortened and, for example, the time of an instantaneous interruption, etc., of the various drive systems 16 to 19 of the head lamps 18a and 18b, etc., after occurrence of an instantaneous power interruption or reset can be shortened.

Figure 4:
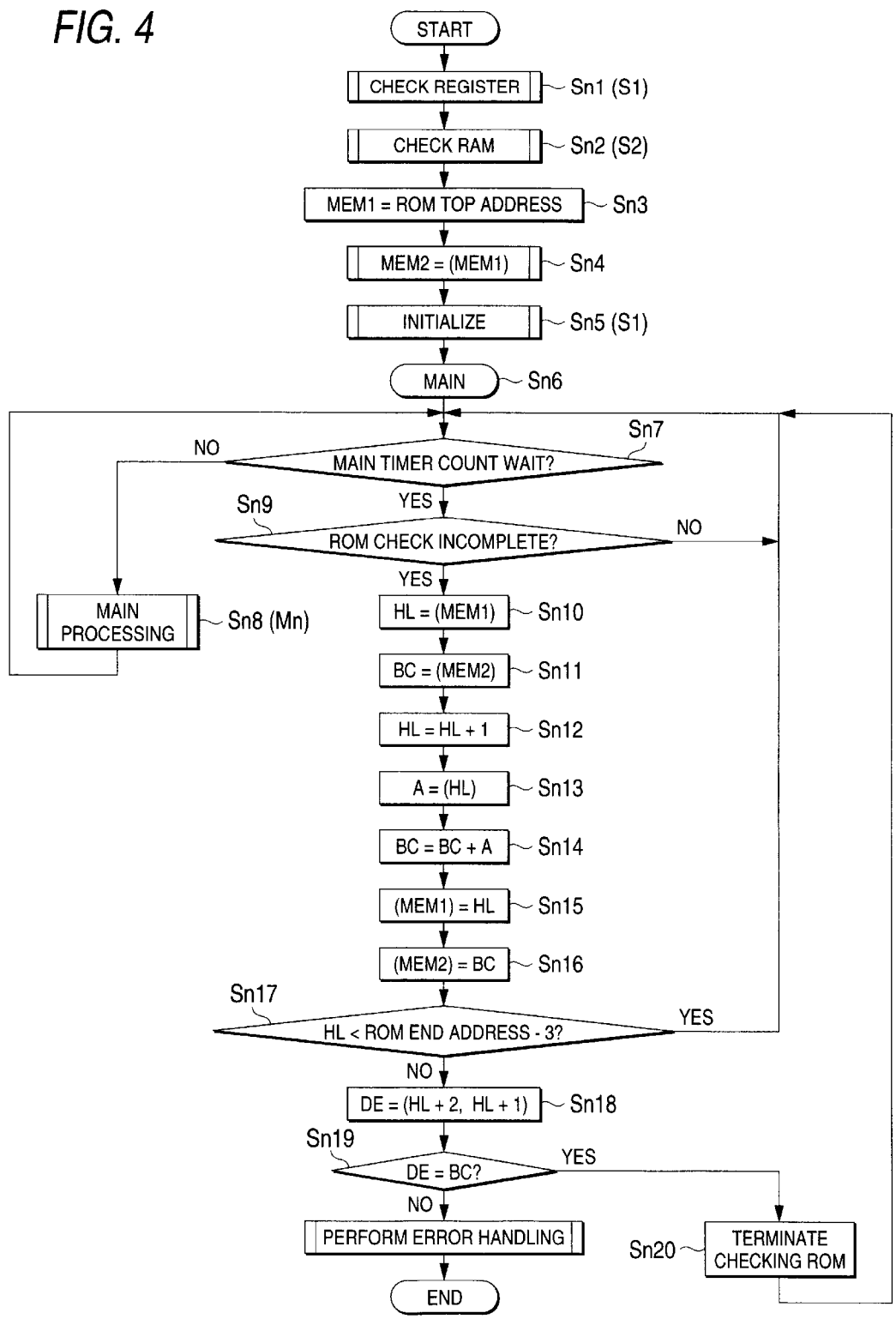
FIG. 4 is a flowchart to show a check routine of ROM in the electronic control unit for an automobile.

Next, checking the ROM 1 at step S3 in FIG. 2 need not necessarily be executed in the initial processing In and, for example, can also be executed in a distributed manner in the main routine at steps S4 and the later steps. FIG. 4 is a flowchart to show a ROM 1 check operation procedure applied in this case. Assume that 16-bit (two-type) reference data for determining whether or not check sum data is valid is previously stored at the end address of the ROM 1.

As described above, checking the ROM 1 is not executed in the initial processing In and is executed in a distributed manner while the main processing Mn at steps S11 to S14 stops because of a count wait after the main processing Mn starts.

That is, as in FIG. 4, first the register 2 is checked at step Sn1 (partial processing of step S1 in FIG. 2), next checking the RAM 4 shown in FIG. 3 is executed at step Sn 2 (S2 in FIG. 2).

At step Sn3, the top address of the ROM 1 is set in a first predetermined area of the RAM 4 (area of address "MEM1"). Next, at step Sn4, the data at the address "MEM1" (in the first area) is also stored in a second predetermined area of the RAM 4 (area of address "MEM2"). Thus, the top address of the ROM 1 is stored in both the first area of the RAM 4 (area of address "MEM1") and the second area (area of address "MEM2").

The remaining processing of the initialization at step S1 (enable or disable of interrupt service, etc.,) is executed at step Sn5. Then, control goes to step Sn6 and execution of the main processing Mn for the various drive systems 16 to 19 is started.

At step Sn7, whether or not the timer in the microcomputer 22 makes a count wait and the operation of the CPU 3 stops is sensed. If the operation of the CPU 3 does not stop, the main processing Mn (step Sn8) is performed, then again control returns to step Sn7 and the operation at steps Sn7 and Sn8 is repeated until a count wait of a main timer occurs.

On the other hand, if the operation of the CPU 3 stops and a count wait of the timer occurs, control goes to step Sn9 and whether or not checking the ROM 1 is incomplete is checked. If checking the ROM 1 is already complete, again control returns to step Sn7 and the processing at step Sn7 and the later is repeated. On the other hand, if checking the ROM 1 is incomplete, the data stored in "MEM1" of the RAM 4 (in the first area) (at the point in time, the top address of the ROM 1) is read and is stored in the HL register as numeric value "HL" (step Sn10), and the data stored in "MEM2" of the RAM 4 (in the second area) (at the point in time, the top address of the ROM 1 is stored as with "MEM1") is read and is stored in a register part (BC register) different from the HL and A registers of the register 2 as numeric value "BC" (step Sn11). At the point in time, the data stored in "MEM1" and the data stored in "MEM2" (the top address of the ROM 1) are the same (see step Sn4), thus the same data (the top address of the ROM 1) is stored in the HL register and the BC register.

The numeric value "BC" in the BC register is used as check sum data at step Sn19 described later and the numeric value "HL" in the HL register is used to mean the address of the ROM 1 to determine the check sum data "BC."

Next, at step Sn12, the numeric value "HL" of the HL register is incremented, then at step Sn13, the contents of the ROM 1 at the new "HL" address after being incremented is written into the A register.

At step Sn14, the sum of the value of the BC register and the value of the A register is written into the BC register as new numeric value "BC" in the BC register.

Next, the value of the address "HL" at the point in time is saved in "MEM1" and the check sum data "BC" is saved in "MEM2." That is, at step Sn15, the numeric value "HL" stored in the HL register (at the point in time, the address value immediately following the top of the ROM 1) is written into the "MEM1" address of the RAM 4. At step Sn16, the contents of the BC register (at the point in time, the sum of the top address value of the ROM 1 and the numeric value "HL") are read and are written into the "MEM2" address of the RAM 4. Thus, the check sum data "BC" can be saved in "MEM2" of the memory and the address value "HL" of the ROM 1 to finally determine the check sum data "BC" can be stored in "MEM1" of the RAM 4 until again the timer wait time is entered after the timer wait time terminates at step Sn7 and the main routine processing (step Sn8) is once executed.

Control goes to step Sn17. At step Sn17, whether or not the check sum data "BC" is complete to the last stage is determined. Specifically, subtracting three from the end address of the ROM 1 is performed and the value of the subtraction result is compared with the numeric value "HL." The reason why subtracting three from the end address of the ROM 1 is performed is as follows: As described later, 16-bit reference data is made up of two areas of the eight-bit area at the end address of the ROM 1 and the eight-bit area at the address immediately preceding the end address and the check sum data "BC" is generated excluding the reference data. At step Sn17, if the value of subtracting three from the end address of the ROM 1 is greater than the address "HL," it is assumed that the accumulation processing does not reach the last stage, and again control returns to step Sn7 and processing at step Sn7 and the later steps is repeated. As the processing is repeated, the data in the ROM 1 at the "HL" address incremented by one is added to the check sum data "BC" one after another as accumulation. If the addition result of the numeric values overflows exceeding 16 bits as the accumulation is repeated, the high-order bits overflowing the 16-bit part are ignored.

On the other hand, at step sn17, if the value of subtracting three from the end address of the ROM 1 is equal to or smaller than the numeric value "HL," it is assumed that the accumulation processing reaches the last stage, and control goes to step Sn18. At step Sn18, the value of adding numeric value "two" to the numeric value "HL" is stored in a predetermined eight-bit (one-byte) register (D register), and the value of adding numeric value "one" to the numeric value "HL" is stored in another predetermined eight-bit (one-byte) register (E register). The value of adding the numeric value "two" to the numeric value "HL" means the top address of the last eight-bit data in the ROM 1 and the value of adding the numeric value "one" to the numeric value "HL" means the top address of the eight-bit data immediately preceding the last data in the ROM 1. The D register and the E register make up a 16-bit register (DE register) comprising the D register as the high-order eight bits and the E register as the low-order eight bits. The value of the DE register provides the reference data collated with the check sum data "BC."

Then, at step Sn19, whether or not the value of the BC register matches the value of the DE register is determined. That is, if the ROM 1 is normal, the reference data written into the ROM 1 (the value "DE" of the DE register) and the check sum data (the value "BC" of the BC register) should equal. Therefore, if the values match, checking the ROM 1 is terminated (step Sn20) and control returns to step Sn7 and processing at step Sn7 and the later steps is repeated. In this case, if a count wait of the main timer does not occur, the main processing Mn at step Sn8 is repeated. On the other hand, if a count wait of the main timer occurs, checking the ROM 1 is already complete and thus "No" is always returned in the determination at step Sn9 and processing at step Sn10 and later is not performed until again the power is turned on or reset is released.

On the other hand, if the value of the DE register and the value of the BC register do not match at step Sn19, it is determined that the ROM data is changed for any reason, and control goes to step Sn21 for executing error handling.

Thus, the ROM check processing is executed in a distributed manner in the wait time of the main processing Mn rather than executed in the initial processing In, so that the time taken in the initial processing In can be shortened drastically and the time of an instantaneous interruption, etc., of the head lamps 18a and 18b after occurrence of an instantaneous power interruption or reset can be shortened.

As described above, the check operation time of the RAM 4 is shortened as in the flowchart of FIG. 3 and the ROM 1 is checked in the wait time of the main processing, whereby the time taken in the initial processing In can be shortened drastically and further the ROM 1 is checked in the main processing Mn, whereby the time of the initial processing In can be furthermore shorted and the time of an instantaneous interruption, etc., of the head lamps after occurrence of an instantaneous power interruption or reset can be shortened.

According to the invention as in aspect 1, the data in the temporary storage circuit at the top address is read, the read contents are written into the next address, and the operation is repeated to the end address, then the data at the end address is compared with the data at the top address only once and if they match, all the RAM is determined to be normal and on the other hand, if they do not match, the RAM is determined to be abnormal. Thus, the data comparison processing may be only one comparison with the end address data and the initial processing time preceding the control processing can be shortened.

According to the invention as in aspect 2, the invention is applied to an electronic control unit for an automobile wherein an instantaneous power interruption or reset easily occurs, whereby the time required for restarting the operation of various drive systems such as an instantaneous interruption of a head lamp, etc., can be shortened and safety on running can be enhanced.

<Configuration>

In an electronic control unit for an automobile according to one embodiment of the invention, check processing of ROM (storage circuit) is distributed in main processing, whereby the time taken in initial processing is shortened.

Figure 7:
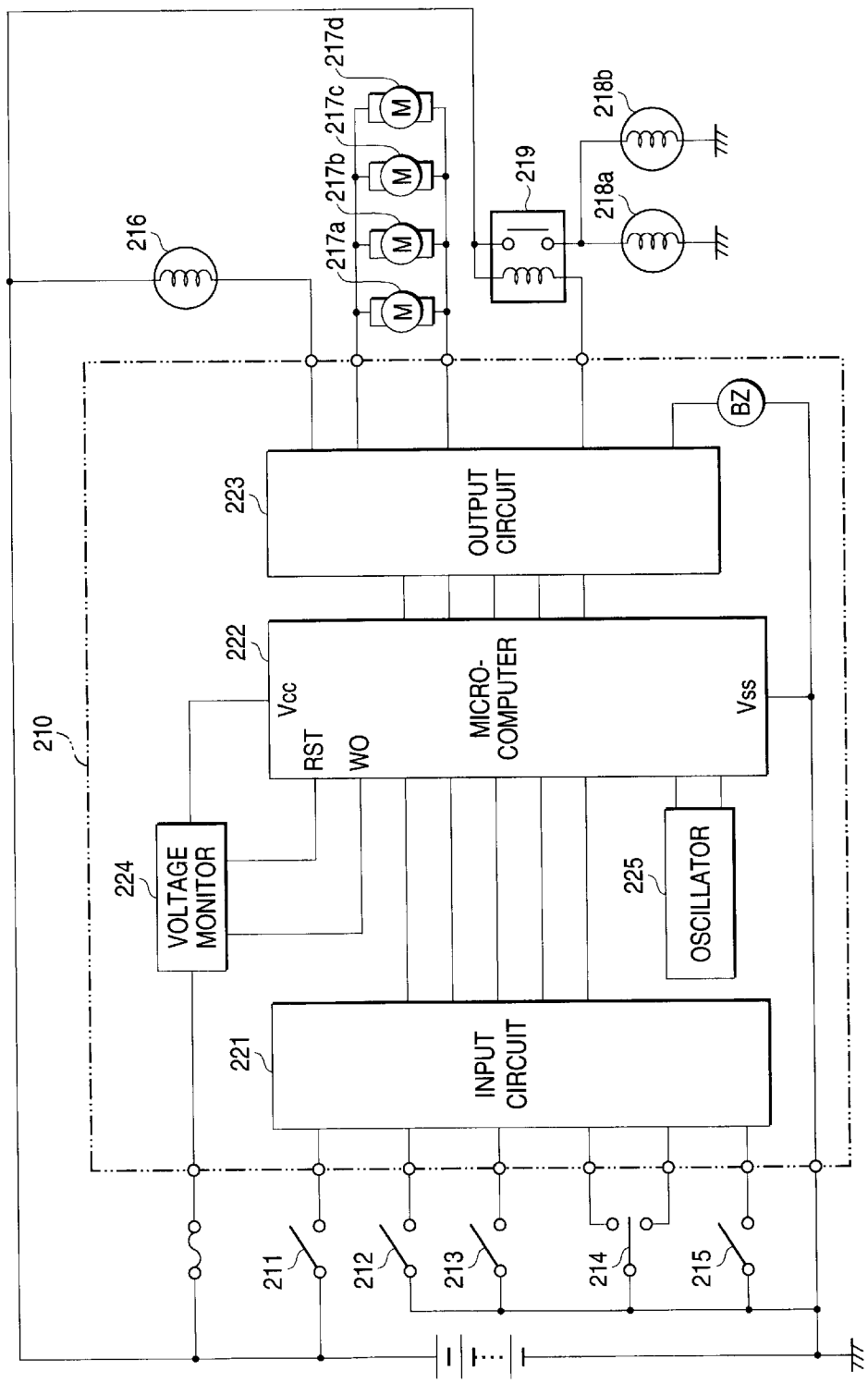
FIG. 7 is a block diagram to show an electronic control unit for an automobile.

FIG. 7 is a block diagram to show an electronic control unit for an automobile 210 according to one embodiment of the invention and its peripheral devices. As in FIG. 7, in the electronic control unit for an automobile 210, input signals from various input systems 211 to 215 of an ignition key 211, a key presence/absence switch 212, a door open/close switch 213, a door lock/unlock switch 214, and a head lamp switch 215 are input, and various drive systems 216 to 219 of a room lamp 216, door lock motors 217a to 217d, a buzzer BZ, and a head lamp relay 219 for switching drive of head lamps 218a and 218b are controlled based on the input signals. Various types of operation control are performed, for example, in such a manner that the buzzer BZ is sounded when the door open/close switch 213 senses an open state of a door although insertion of a key is sensed with the key presence/absence switch 212, that the door lock motors 217a to 217d are driven for locking or unlocking a door as the door lock/unlock switch 214 is switched on or off, and that the head lamp relay 219 is operated for switching drive of the head lamps 218a and 218b as the head lamp switch 215 is switched on or off.

The input signals from the various input systems 211 to 215 are input through an input circuit 221 in the electronic control unit for an automobile 210 to a microcomputer 222, which then performs various types of branch determination processing and operation processing on the input signals and outputs drive signals through an output circuit 223 to the various drive systems 216 to 219. A voltage monitor circuit (watchdog circuit) 224 always monitors whether or not the microcomputer 222 is in the normal state. In FIG. 7, numeral 225 denotes an oscillator for ordering an operation clock of the microcomputer 222.

Figure 11:
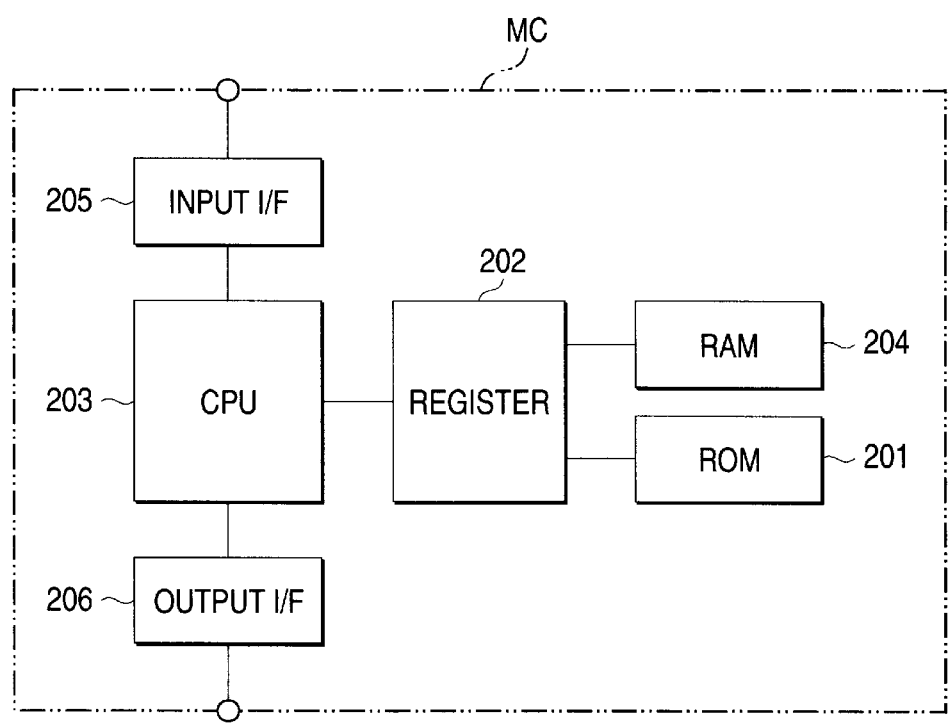
FIG. 11 is a block diagram to show the internal configuration of a general electronic control unit for an automobile.
Figure 12:
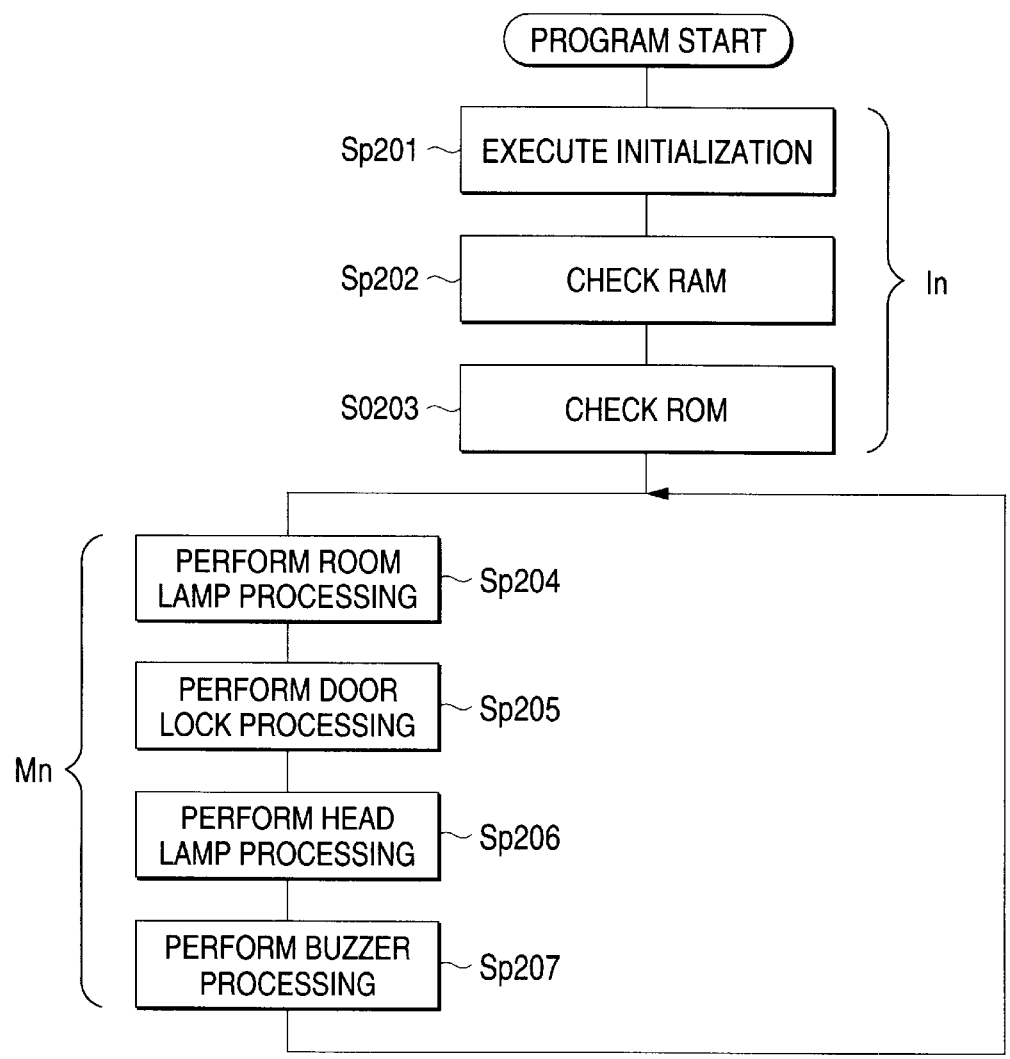
FIG. 12 is a flowchart to show a general operation procedure of an electronic control unit for an automobile in a related art.

The internal configuration of the microcomputer 222 (MC) is the same as that of the general microcomputer shown in FIG. 11 and therefore will not be discussed again. A main timer is installed in the microcomputer 222 for counting the time during which a CPU 203 does not operate, whereby the presence or absence of idle time of the CPU 203 can be sensed.

<Operation>

Figure 8:
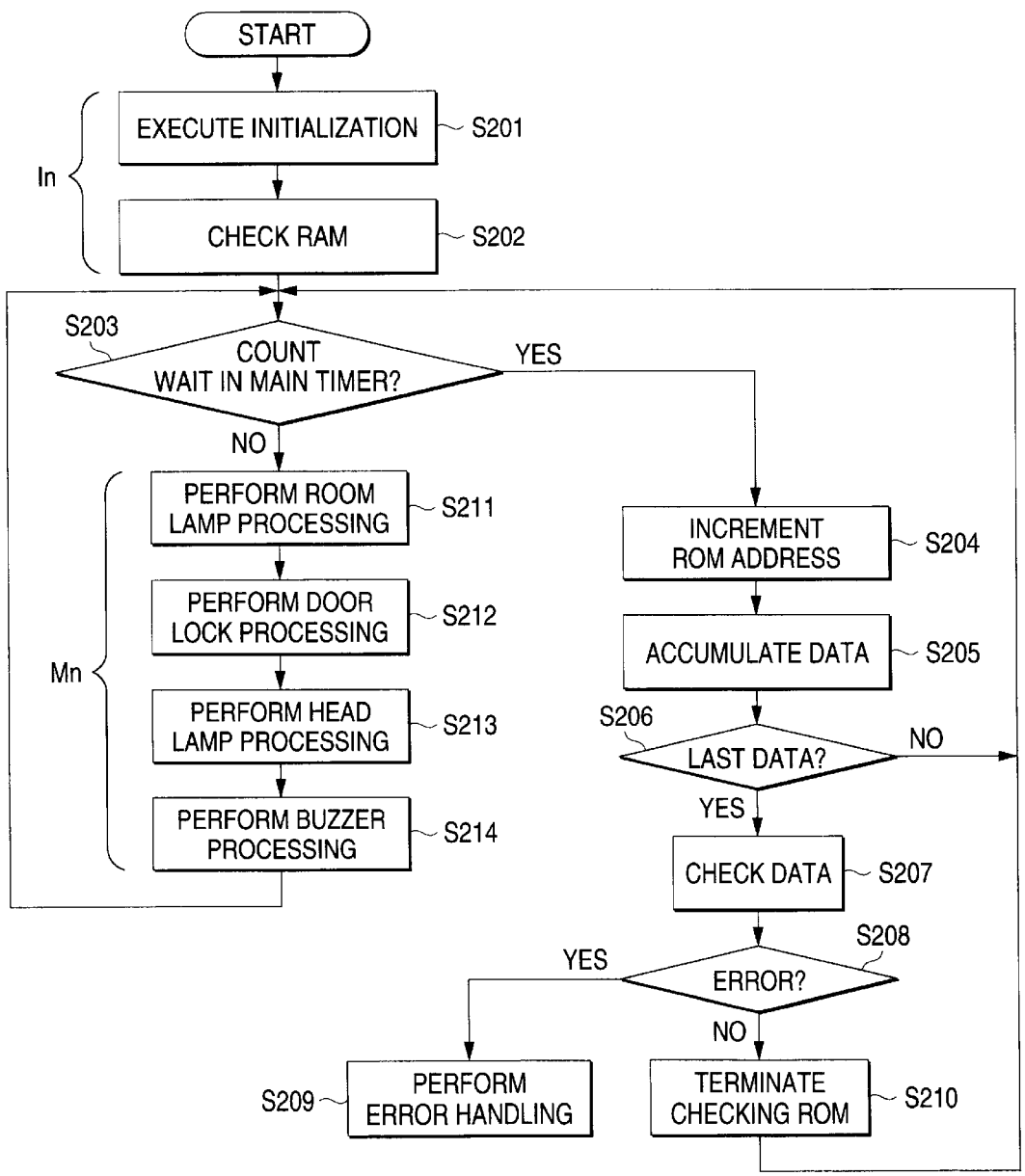
FIG. 8 is a flowchart to show a general operation procedure of the electronic control unit for an automobile.

FIG. 8 is a general operation flowchart of the electronic control unit for an automobile 210. After the power of the electronic control unit for an automobile 210 is turned on or reset is released, initialization is executed at step S201. Specifically, at step S1, the operation frequency magnification of the CPU 203 (FIG. 11) to the operation clock provided by the oscillator 225, ports in the input circuit 221 and the output circuit 223, enable or disable of interrupt service, and the like are set. Checking a register 202 is also executed in the initialization.

Next, at step S202, RAM 204 in the microcomputer 222 is checked.

Then, at step S203, whether or not a count wait (idle time of the CPU 203) occurs in the main timer of the microcomputer 222 is determined. If it is determined that an idle time occurs in the CPU 203, while the address of ROM (storage circuit) 201 is incremented (step S204), data in the ROM 201 is accumulated one after another to provide check sum data (step S205). If the accumulation processing does not reach the last stage, control returns to step S203 for each accumulation and the processing is repeated (step S206). When the accumulation processing reaches the last stage, the check sum data at the last stage is checked as at step S207. If an error occurs (step S208), predetermined error handling is executed (step S209). On the other hand, if an error does not occur, checking the ROM 201 is terminated and control returns to step S203.

Meanwhile, if main timer count wait (idle time of the CPU 203) does not occur at step S203, main processing Mn concerning the various drive systems 216 to 219 including room lamp processing, door lock processing, head lamp processing, and buzzer processing is executed repeatedly every predetermined time at steps S211 to S214. In doing so, the initial processing In may include only two steps of S201 and S202 and the time of the initial processing In can be shortened.

Step S202 in FIG. 8 will be discussed in detail with reference to a flowchart of FIG. 9.

Figure 6:
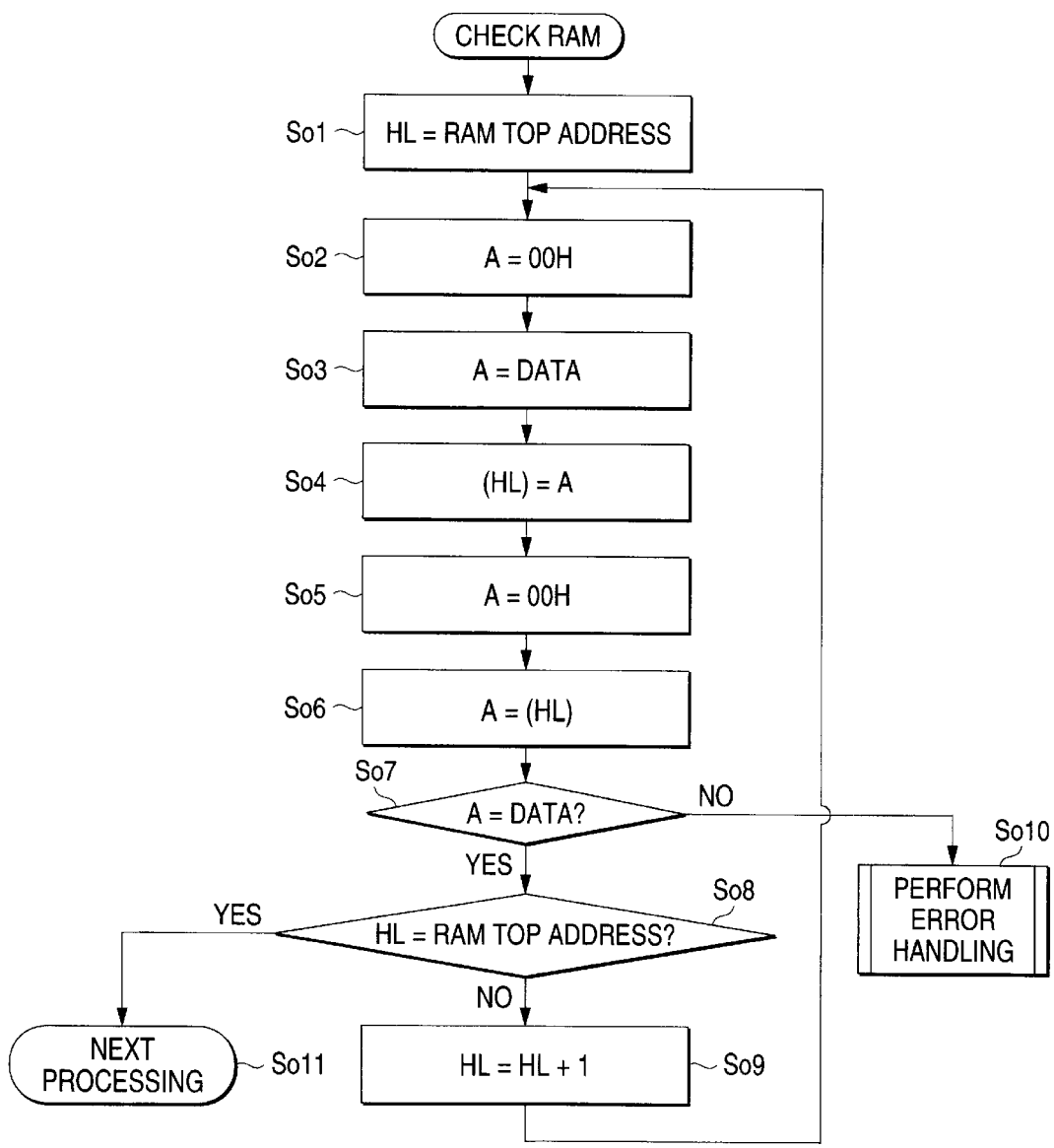
FIG. 6 is a flowchart to show a check routine of RAM in an electronic control unit for an automobile in a related art.

When the RAM 204 is checked, as in FIG. 6, first the top address of the RAM 204 is set in a predetermined 16-bit HL register in the register 202 at step Sm201. At step Sm202, a numeric value of "00H" is stored in an eight-bit register (called A register) different from the HL register for resetting. Subsequently, at step Sm203, predetermined specific data (data) is stored in the A register. At step Sm204, the data in the A register is written into "HL" address of the HL register and at step Sm205, a numeric value of "00H" is stored in the A register for resetting, then at step Sm206, the data stored at the "HL" address of the HL register is read into the A register. At step Sm207, the "HL" address of the HL register is incremented, then at step Sm208, the data in the A register is written into the post-incremented "HL" address.

The operation at steps Sm205 to Sm208 is repeated until the address "HL" reaches the end address of the RAM 204 (step Sm209). At step Sm210, the value stored at the address immediately preceding the end address of the RAM 204 (the data stored in the A register at step Sm206) is compared with the value of the first "data" to determine whether or not they match. If they match, further the end address is checked, namely, whether or not the value stored at the end address of the RAM 204 (the data stored in the A register at step Sm206) matches the value of the first "data" is checked (not shown in FIG. 9), then control goes to the next step (step Sm211). In this case, if the value stored at the end address of the RAM 204 (the data stored in the A register at step Sm206) does not match the value of the first "data" although not shown in FIG. 9, control goes to step Sm212 and error handling is executed.

On the other hand, if it is determined at step Sm210 that the value stored at the address immediately preceding the end address of the RAM 204 (the data stored in the A register at step Sm206) differs from the value of the first "data," error handling is executed at step Sm212.

Figure 13:
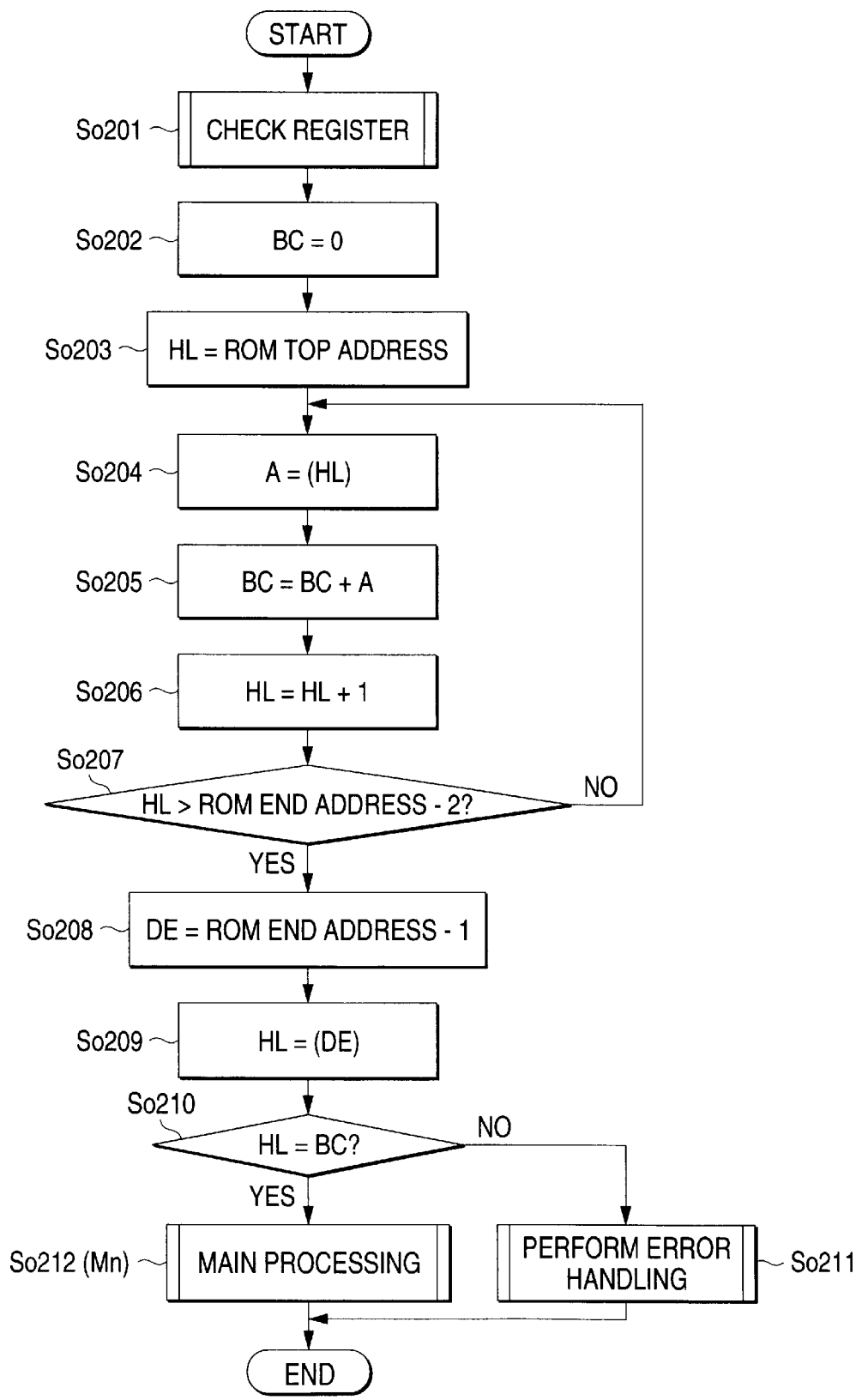
FIG. 13 is a flowchart to show a check routine of RAM in the electronic control unit for an automobile in the related art.

Thus, in the electronic control unit for an automobile 210, the data in the RAM 204 indicated by the top address is read, the read contents are written into the next address, and the operation is repeated to the end address, then the RAM value at the end address is compared with the RAM value at the top address only once and if the values are the same, all the RAM is determined to be normal. Thus, the data comparison processing may be only one comparison with the end address data as compared with the example in the related art previously described with reference to FIG. 13; the RAM 204 check routine can be simplified and it is made possible to drastically shorten the check processing time. Therefore, the time taken in the initial processing In (steps S201 to S203 in FIG. 8) can be shortened and, for example, the time of an instantaneous interruption, etc., of the various drive systems 216 to 219 of the head lamps 218a and 218b, etc., after occurrence of an instantaneous power interruption or reset can be shortened.

Next, checking the ROM 201 following step S203 in FIG. 8 will be discussed in detail with reference to a flowchart of FIG. 10. Assume that 16-bit (two-type) reference data for determining whether or not check sum data is valid is previously stored in the last 16-bit area of the ROM 201.

As described above, checking the ROM 201 is not executed in the initial processing In and is executed in a distributed manner while the main processing Mn at steps S211 to S214 stops because of a count wait after the main processing Mn starts.

Figure 9:
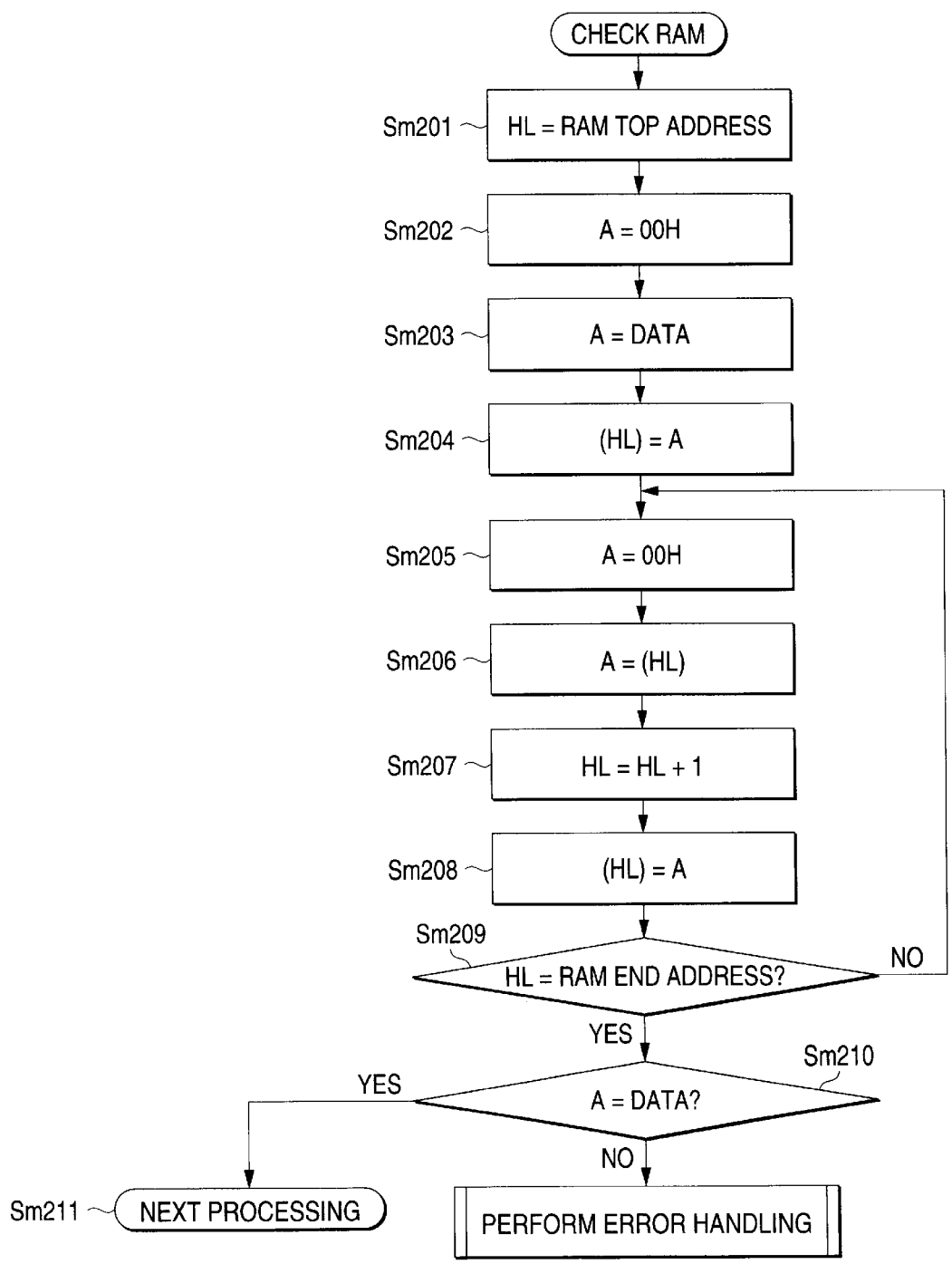
FIG. 9 is a flowchart to show a check routine of RAM in the electronic control unit for an automobile.
Figure 10:
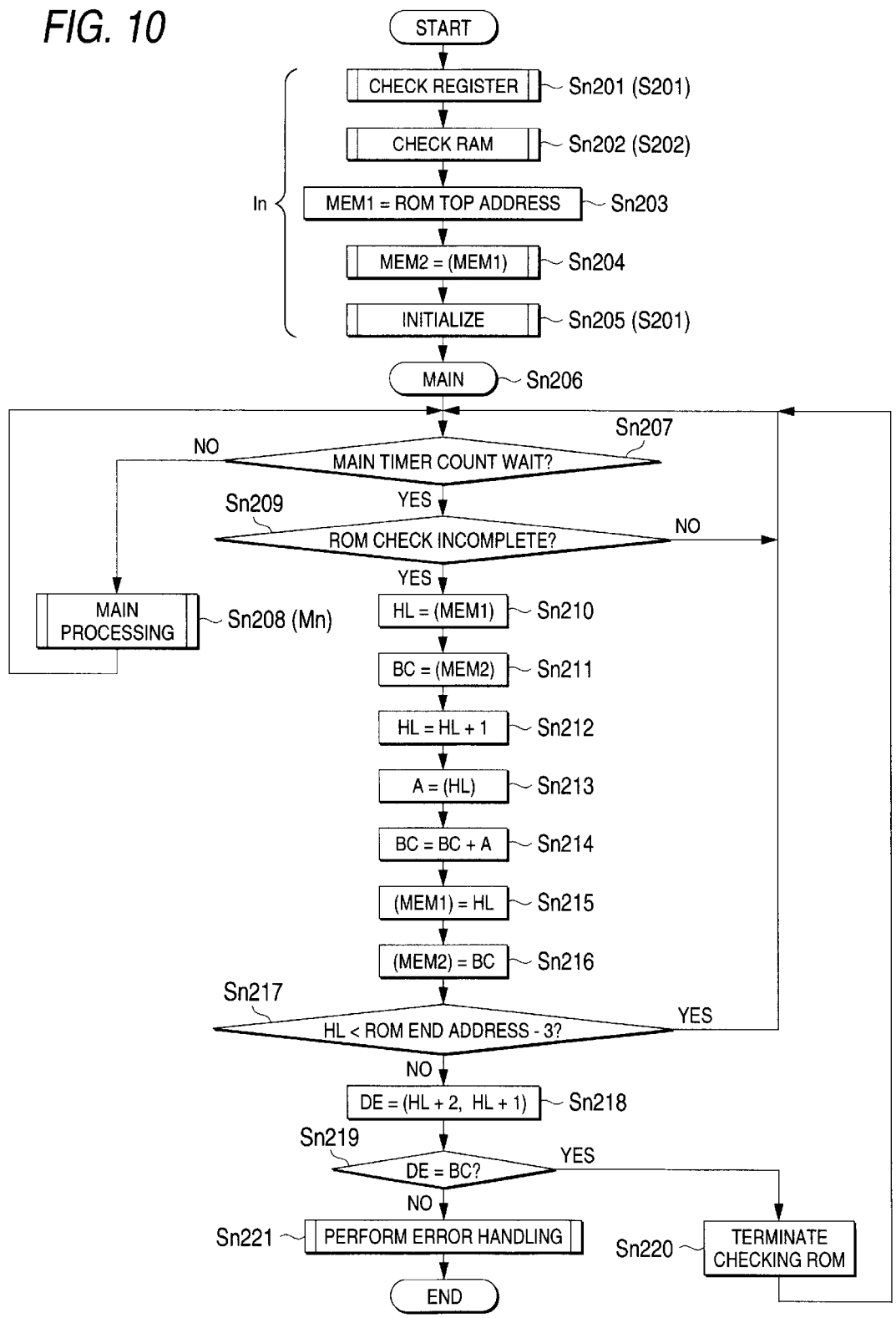
FIG. 10 is a flowchart to show a check routine of ROM in the electronic control unit for an automobile according to one embodiment of the invention and its peripheral devices.

That is, as in FIG. 10, first the register 202 is checked at step Sn201 (partial processing of step S201 in FIG. 8), next checking the RAM 204 shown in FIG. 9 is executed at step Sn 202 (S202 in FIG. 8).

At step Sn203, the top address of the ROM 201 is set in a first predetermined area of the RAM 204 as a numeric value of "MEM1." Next, step Sn204, the eight-bit data starting at the address "MEM1" in the ROM 201 (namely, the top eight-bit data in the ROM 201) is read and is stored in a second predetermined area of the RAM 204 as a numeric value of "MEM2." Thus, the eight-bit data starting at the top address of the ROM 201 is stored in the second area of the RAM 204 (numeric value "MEM2").

The remaining processing of the initialization at step S201 (enable or disable of interrupt service, etc.,) is executed at step Sn205. Then, control goes to step Sn206 and execution of the main processing Mn for the various drive systems 216 to 219 is started.

At step Sn207, whether or not the timer in the microcomputer 222 makes a count wait and the operation of the CPU 203 stops is sensed. If the operation of the CPU 203 does not stop, the main processing Mn (step Sn208) is performed, then again control returns to step Sn207 and the operation at steps Sn207 and Sn208 is repeated until a count wait of the main timer occurs.

On the other hand, if the operation of the CPU 203 stops and a count wait of the timer occurs, control goes to step Sn209 and whether or not checking the ROM 201 is incomplete is checked. If checking the ROM 201 is already complete, again control returns to step Sn207 and the processing at step Sn207 and the later is repeated. On the other hand, if checking the ROM 201 is incomplete, the numeric value "MEM1" is read from the RAM 204 and the value of "MEM1" is stored in the HL register as numeric value "HL" (step Sn210). In addition, the data already stored in the RAM 204 as "MEM2" (at the point in time, eight-bit data is stored from the top register of the ROM 201) is read and is stored in a 16-bit register part (BC register) different from the HL and A registers of the register 202 as numeric value "BC" (step Sn211).

The contents of the BC register are used as check sum data at step Sn219 described later and the numeric value "HL" in the HL register means the address of the ROM 201 for counting to determine whether or not the accumulation of the check sum data "BC" reaches the last stage. The numeric value "BC" in the BC register is set to 16-bit length into which an eight-bit B register and an eight-bit C register are combined. If eight-bit data in the ROM 201 is stored in the low-order eight bits of "BC," the high-order eight bits of "BC" is set to a numeric value of "00000000." However, while accumulation is repeated on the numeric value "BC" of the BC register one after another, as described later, the value of the high-order eight bits is also increased gradually.

Next, at step Sn212, the numeric value "HL" of the HL register meaning the address of the ROM 201 is incremented by one byte (eight bits), then at step Sn213, the eight-bit data at the new "HL" address in the ROM 201 after being incremented is written into the A register.

At step Sn214, the sum of the 16-bit numeric value of the BC register and the eight-bit numeric value of the A register is written into the BC register as new 16-bit numeric value "BC" in the BC register.

Next, at steps Sn215 and Sn216, the value of the address "HL" at the point in time is saved in "MEM1" and the check sum data "BC" is saved in "MEM2." Thus, to later return to step Sn207 and execute the main processing Mn (step Sn208), the address value "HL" of the ROM 201 still in progress can be stored in "MEM1" of the RAM 204 and the check sum data "BC" still in progress can be stored in "MEM2" of the memory until the time at which wait time of the CPU 203 again occurs.

Control goes to step Sn217. At step Sn217, whether the accumulation processing of the check sum data "BC" is still in progress or is complete to the last stage is determined. Specifically, subtracting three bytes from the end address of the ROM 201 is performed and the address value of the subtraction result is compared with the numeric value "HL." The reason why subtracting three bytes from the end address of the ROM 201 is performed is as follows: As described later, 16-bit reference data is made up of two areas of the last eight-bit area of the ROM 201 (namely, the area from the address of subtracting one byte from the end address to the end address) and the eight-bit area immediately preceding the last eight-bit area (namely, the area from the address of subtracting two bytes from the end address to the address of subtracting one byte from the end address) and when the last eight-bit area excluding the reference data (namely, the area from the address of subtracting three bytes from the end address to the address of subtracting two bytes from the end address) is added to the check sum data "BC," the accumulation processing is terminated.

Specifically, at step Sn217, if the address "HL" is smaller than the value of subtracting three bytes from the end address of the ROM 201, it is assumed that the accumulation processing does not reach the last stage, and again control returns to step Sn207 and processing at step Sn207 and the later steps is repeated. As the processing is repeated, the data at the "HL" address incremented by one in the ROM 201 is added to the check sum data "BC" one after another as accumulation. If the addition result of the numeric values overflows exceeding 16 bits as the accumulation is repeated, the high-order bits overflowing the 16-bit part are ignored.

On the other hand, at step sn217, if the numeric value "HL" is equal to or greater than the value of subtracting three bytes from the end address of the ROM 201, the fact that the cumulative data reaches the last eight-bit data (namely, the area from the address of subtracting three bytes from the end address to the address of subtracting two bytes from the end address) excluding the last 16-bit reference data (namely, the area from the address of subtracting two bytes from the end address to the end address) is sensed and thus it is assumed that the accumulation processing reaches the last stage, and control goes to step Sn218.

At step Sn218, the eight-bit (one-byte) data starting at the address of adding two bytes to the address "HL" is read in the ROM 201 and is stored in a predetermined eight-bit (one-byte) register (D register). In addition, the eight-bit (one-byte) data starting at the address of adding one byte to the address "HL" is read and is stored in a predetermined eight-bit (one-byte) register (E register). The address of adding two bytes to the address "HL" means the top address of the last eight-bit data in the ROM 201 and the value of adding one byte to the address "HL" means the top address of the eight-bit data immediately preceding the last data in the ROM 201. The D register and the E register make up a 16-bit register (DE register) comprising the D register as the high-order eight bits and the E register as the low-order eight bits, and the value of the DE register provides the reference data collated with the check sum data "BC."

Then, at step Sn219, whether or not the value of the BC register matches the value of the DE register is determined. That is, if the ROM 201 is normal, the reference data written into the ROM 201 (the value "DE" of the DE register) and the check sum data (the value "BC" of the BC register) should equal. Therefore, if the values match, checking the ROM 201 is terminated (step Sn220) and control returns to step Sn207 and processing at step Sn207 and the later steps is repeated. In this case, if a count wait of the main timer does not occur, the main processing Mn at step Sn208 is repeated. On the other hand, if a count wait of the main timer occurs, checking the ROM 201 is already complete and thus "No" is always returned in the determination at step Sn209 and processing at step Sn210 and later is not performed until again the power is turned on or reset is released.

On the other hand, if the value of the DE register and the value of the BC register do not match at step Sn229, it is determined that the ROM data is changed for any reason, and control goes to step Sn221 for executing error handling.

Thus, the ROM check processing is executed in a distributed manner in the wait time of the main processing Mn rather than executed in the initial processing In, so that the time taken in the initial processing In can be shortened drastically and the time of an instantaneous interruption, etc., of the head lamps 218a and 218b after occurrence of an instantaneous power interruption or reset can be shortened.

According to the invention as in aspect 3 or 4, the ROM is checked in a distributed manner in the wait time of the control processing rather than checked in the initial processing, so that the time taken in the initial processing preceding the control processing can be shortened drastically.

According to the invention as in aspect 5, the invention is applied to an electronic control unit for an automobile wherein an instantaneous power interruption or reset easily occurs, whereby the time required for restarting the operation of various drive systems such as an instantaneous interruption of a head lamp, etc., can be shortened and safety on running can be enhanced.

What is claimed is:

1. A check method of a temporary storage circuit in an electronic control unit for executing an operation check of a temporary storage circuit before the control processing in said electronic control unit wherein a central control unit once stores various data and a software program in said temporary storage circuit and executes predetermined control processing, said check method comprising:

the first step of predetermined data into the top address of said temporary storage circuit;

the second step of reading the data at the top address and writing the data into the next address and the later addresses repeatedly in order; and the third step of comparing the data at the end address with the data at the top address only once after the data is written into the end address at the second step, and determining that the read operation and the write operation of the data at all addresses of said temporary storage circuit are normal and on the other hand, if the data at the end address and the data at the top address are the same, determining that the read operation and the write operation of said temporary storage circuit are abnormal, if the data at the end address and the data at the top address are not the same.

2. The check method of the temporary storage circuit in said electronic control unit as claimed in claim 1, wherein said electronic control unit is an electronic control unit for an automobile, installed in an automobile, and the control processing executed by said central control unit of said electronic control unit is a drive control of various drive systems of an automobile.

3. A check method of a storage circuit in an electronic control unit for executing an operation check of said storage circuit in said electronic control unit wherein a central control unit executes predetermined control processing based on various data and a software program previously stored in said storage circuit, said check method comprising:

the first step of sensing whether or not the predetermined control processing is in a time wait state after predetermined initial processing;

the second step of executing the predetermined control processing if the fact that the predetermined control processing is not in a time wait state is detected at said first step; and the third step of checking the storage circuit within the wait time of the predetermined control processing only if the fact that the predetermined control processing is in a time wait state is detected at said first step.

4. The check method of the storage circuit in said electronic control unit as claimed in claim 3, wherein the third step comprises the steps of:

sensing whether or not checking said storage circuit is complete, returning to the first step, if checking said storage circuit is complete;

incrementing an address of said storage circuit, each time the fact that checking said storage circuit is incomplete;

accumulating data at the incremented address to provide check sum data, each time the address is incremented;

sensing whether or not the accumulation processing reaches the last stage based on the incremented address, each time the check sum data is provided, and returning to the first step, if the accumulation processing does not reach the last stage; and if the fact the accumulation processing reaches the last stage is detected, comparing the check sum data with predetermined reference data, determining that said storage circuit operates normally and on the other hand, if the check sum data and the reference data match, and determining that the storage circuit is abnormal, if the check sum data and the reference data do not match.

5. The check method of said storage circuit in said electronic control unit as claimed in claim 3, wherein said electronic control unit is an electronic control unit for an automobile, installed in an automobile, and the control processing executed by said central control unit of said electronic control unit is a drive control of various drive systems of an automobile.

* * * * *